(12) United States Patent
Köhler et al.

(10) Patent No.: US 7,692,334 B2
(45) Date of Patent: Apr. 6, 2010

(54) PHOTOVOLTAIC SYSTEM HAVING A SOLAR MODULE

(75) Inventors: Claus Köhler, Leutkirch (DE); Roland Morent, Wangen (DE)

(73) Assignee: Diehl AKO Stiftung & Co. KG, Wangen (DE)

( * ) Notice: Subject to any disclaimer, the term of this patent is extended or adjusted under 35 U.S.C. 154(b) by 492 days.

(21) Appl. No.: 11/703,477

(22) Filed: Feb. 7, 2007

(65) Prior Publication Data
US 2007/0186969 A1 Aug. 16, 2007

(30) Foreign Application Priority Data
Feb. 14, 2006 (DE) .......... 10 2006 006 967
Jun. 8, 2006 (DE) .......... 10 2006 026 661

(51) Int. Cl.
*H02J 1/00* (2006.01)
(52) U.S. Cl. .......... 307/71; 323/906; 136/244
(58) Field of Classification Search .......... 323/283, 323/288, 299, 224, 906, 300; 363/37, 61, 363/63; 307/38–42, 85, 149, 64; 320/112, 320/113, 115, 128, 130–136; 136/244, 291, 136/293
See application file for complete search history.

(56) References Cited

U.S. PATENT DOCUMENTS
6,650,031 B1 * 11/2003 Goldack .......... 307/149

FOREIGN PATENT DOCUMENTS
DE 88 15 963.9 3/1989
DE 20 2005 001 044 U1 5/2005

* cited by examiner

Primary Examiner—Rajnikant B Patel
(74) Attorney, Agent, or Firm—Laurence A. Greenberg; Werner H. Stemer; Ralph E. Locher

(57) ABSTRACT

A photovoltaic system includes a solar module having at least one solar cell. In order to reduce the power loss of the solar module when a solar module is in shade or is defective, a semiconductor switching element is connected in parallel with the solar module and drive electronics block the semiconductor switching element when the solar module is generating power and otherwise switch the semiconductor switching element to low impedance in order to bridge the solar module.

7 Claims, 2 Drawing Sheets

PHOTOVOLTAIC SYSTEM HAVING A SOLAR MODULE

CROSS-REFERENCE TO RELATED APPLICATIONS

This application claims the priority, under 35 U.S.C. §119, of German Patent Applications DE 10 2006 006 967.6, filed Feb. 14, 2006, and DE 10 2006 026 661.7, filed Jun. 8, 2006; the prior applications are herewith incorporated by reference in their entirety.

BACKGROUND OF THE INVENTION

Field of the Invention

The present invention relates to a photovoltaic system having a solar module with at least one solar cell.

A photovoltaic system usually includes a multiplicity of solar modules which are connected in series to form so-called strings. The solar modules usually contain a plurality of solar cells. The string or strings feed(s) an inverter which supplies the energy of the solar modules to an AC power supply system or a load in the correct phase and with the correct voltage.

The layout of a solar module according to German Utility Model DE 88 15 963 U1, is illustrated in FIG. 1 and described in more detail below. Such solar modules have series-connected solar cells which are each bridged by a respective shunt diode.

In the case of the solar module described in German Utility Model DE 88 15 963 U1, an indicating element in the form of a light-emitting diode or a moving-coil instrument is also connected in parallel with the solar modules. That indicating element indicates the flow of current through the shunt diode so that a solar module which is in shade or is defective can be detected.

German Utility Model DE 20 2005 001 044 U1 discloses a photovoltaic system having a plurality of strings of series-connected solar modules and an indicating unit being connected downstream of each string. The indicating unit uses a light-emitting diode to indicate whether or not the string in question is providing power.

One disadvantage of the above-described solar modules having a shunt diode connected in parallel with the solar module is that those shunt diodes generate a relatively high power loss when a current flows. If, for example, a string current of 5 A flows through such a shunt diode having a forward voltage of 1 V, 5 W are converted into heat in the shunt diode. On one hand, that energy is lost to the system and can no longer be fed into the inverter. On the other hand, the shunt diode becomes hot and heats its surroundings, as a result of which an adjacent solar cell may possibly be damaged.

SUMMARY OF THE INVENTION

It is accordingly an object of the invention to provide a photovoltaic system having a solar module, which overcomes the hereinafore-mentioned disadvantages of the heretofore-known devices of this general type in such a manner that a power loss of a module is reduced in comparison with a conventional solar module in the case of a solar module which is in the shade or is defective.

With the foregoing and other objects in view there is provided, in accordance with the invention, a photovoltaic system. The photovoltaic system comprises a solar module having at least one solar cell. A semiconductor switching element is connected in parallel with the solar module. Drive electronics block the semiconductor switching element during power generation by the solar module and otherwise switch the semiconductor switching element to low impedance to bridge the solar module.

Replacing the shunt diode of a conventional solar module, which is connected in parallel with the solar module, with a semiconductor switching element which can be driven and has a low impedance in the on state, in particular has a considerably lower impedance than a shunt diode, achieves a considerably lower power loss of the solar module, in the case of a solar module which is in shade or is defective, and reduces heating. In other words, more energy can be supplied to the inverter by the solar module or by the string containing a plurality of such solar modules.

In accordance with another feature of the invention, the semiconductor switching element is formed by a MOSFET transistor, in particular a power MOSFET transistor. The use of a MOSFET transistor is particularly advantageous because a parallel diode which can be effective as a shunt diode is integrated in its structure. In the case of a faulty transistor function of this semiconductor switching element, the function of the shunt diode may thus still be present, so that the solar module remains operational albeit with the disadvantages of a conventional solar module.

In accordance with a further feature of the invention, a series circuit including a diode and a capacitor is connected in parallel with the solar module. The capacitor is charged by the solar module through the diode in the case of solar radiation and otherwise feeds the drive electronics.

In accordance with an added feature of the invention, the drive electronics contain a multivibrator having an output signal which is short-circuited when the solar module is generating power. Alternatively, the drive electronics may be formed by an integrated circuit.

In accordance with an additional feature of the invention, the drive electronics generate a pulsed control signal having short pulse pauses. In this way, during the time window generated by the short pulse pauses, the solar module can respectively return to its normal method of operation with a semiconductor switching element which is turned off.

In accordance with a concomitant feature of the invention, the solar module is one of at least one string of a plurality of series-connected solar modules.

Other features which are considered as characteristic for the invention are set forth in the appended claims.

Although the invention is illustrated and described herein as embodied in a photovoltaic system having a solar module, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
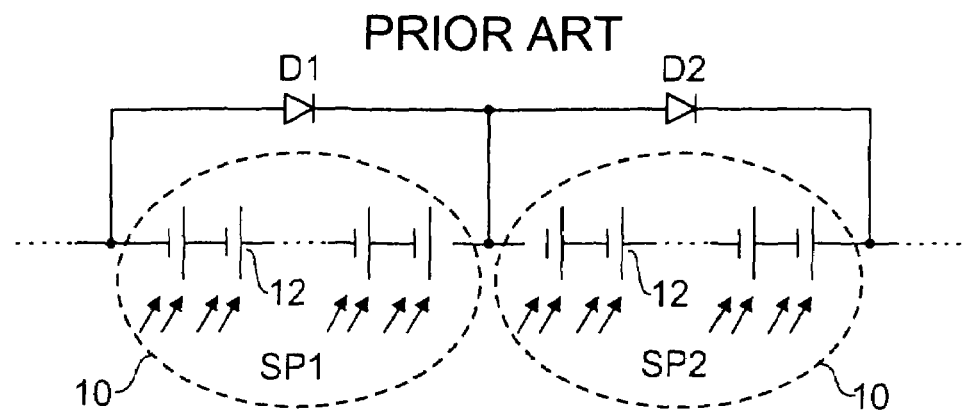
FIG. 1 is a simplified schematic circuit diagram illustrating two series-connected solar modules according to the prior art.

Referring now to the figures of the drawings in detail and first, particularly, to FIG. 1 thereof, there is seen a layout of a solar module which is disclosed, for example, in German Utility Model DE 88 15 963 U1. Solar modules 10 having series-connected solar cells 12 are each bridged by a respective shunt diode D1, D2. In the case of solar radiation, that is to say when the solar module 10 is generating power, the shunt diode D1, D2 is reverse-biased and thus does not influence the function of the solar module. If a solar module in a string is temporarily shaded, that solar module 10 no longer generates a voltage and the shunt diode D1, D2 accepts string current from the remaining solar modules in the string. The solar module which is in the shade is protected and the functionality of the string is retained. In the case of a defective solar panel 12, the shunt diode D1, D2 functions in a similar manner and the functionality of the remaining string is retained.

A fundamental layout and fundamental method of operation of a solar module for a photovoltaic system according to the present invention will now first of all be described with reference to FIGS. 2 and 3. An exemplary embodiment of drive electronics of such a solar module will then be explained in more detail with reference to FIG. 4.

A solar module, as is described in more detail below, is used, for example, in a photovoltaic system having one or more strings containing a plurality of series-connected solar modules of this type. The strings feed an inverter which supplies electrical energy generated by the solar modules to an AC power supply system or directly to a load in a correct phase and with a correct voltage.

Figure 2:
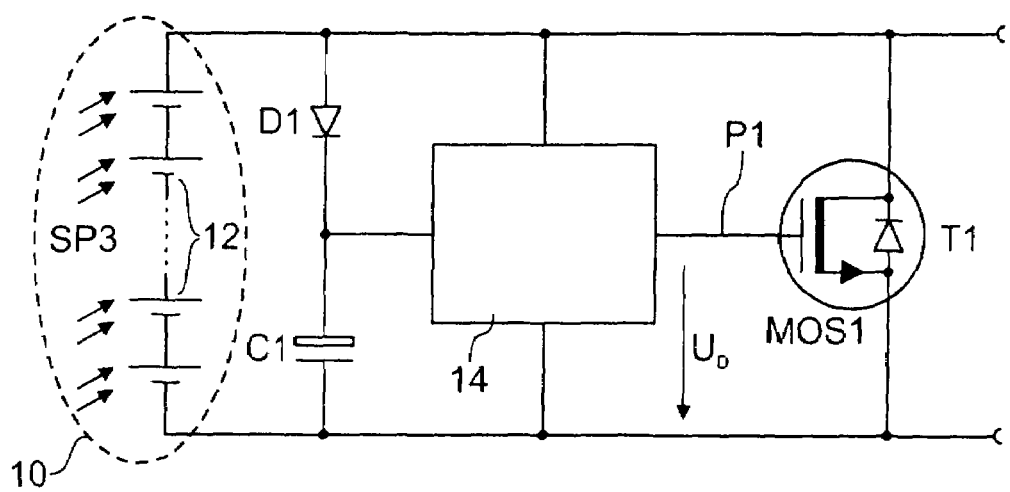
FIG. 2 is a simplified schematic and block diagram of a solar module according to one preferred exemplary embodiment of the present invention.

Referring now to FIG. 2, there is seen a solar module 10 which contains a plurality of solar cells 12 and a semiconductor switching element T1 being connected in parallel with the module 10. This semiconductor switching element T1 is preferably a MOSFET transistor, in particular a power MOSFET transistor. A diode (indicated in an equivalent circuit diagram in FIG. 2) which can be used as a shunt diode, is integrated in the structure of the transistor T1. Even in the case of a faulty transistor function of the MOSFET transistor T1, this diode can still ensure the functionality of the solar module 10 in a similar manner to a conventional solar module (see FIG. 1, for example).

Drive electronics 14 are associated with the semiconductor switching element T1. These drive electronics 14 receive their supply voltage from a capacitor C1, for example an electrolytic capacitor, which is connected in parallel with the solar module 10. In the case of solar radiation, the capacitor C1 is charged by the solar module 10 through a diode D1 which, for this purpose, is connected in parallel with the solar module 10 and is connected in series with the capacitor C1. The diode D1 is forward-biased in the case of solar radiation. If the solar module 10 is switched off due to shade, for example, the diode D1 changes to the reverse direction and decouples the capacitor C1 from the voltage of the solar module 10.

The drive electronics 14 are constructed to have a high impedance for a very small power consumption. They generate an output signal $U_D$ which is applied, as a control signal, to a control electrode of the semiconductor switching element T1. A temporal profile of the output signal $U_D$ is illustrated in FIG. 3. However, while the solar module 10 is generating power, a voltage pattern of the drive electronics 14 is suppressed, that is to say $U_D$=0 V, so that the semiconductor switching element T1 remains turned off.

Figure 3:
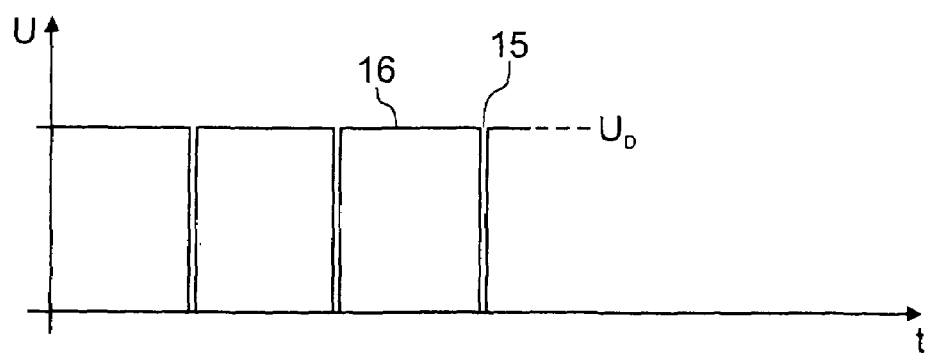
FIG. 3 is a timing diagram of an output signal generated by drive electronics of the solar module of FIG. 2.

In the case of a solar module 10 which is in the shade or is defective, the voltage pattern illustrated by way of example in FIG. 3 is applied to the semiconductor switching element T1. The voltage pattern $U_D$ contains, in particular, periodic control pulses with short pulse pauses 15 in between. During pulse durations 16, the semiconductor switching element T1 is turned on, so that the solar module 10 is bridged for at least one pulse duration. In this case, the on state of the semiconductor switching element. T1 has a considerably lower impedance than that of a shunt diode D1, D2 (see FIG. 1) which is conventionally used. During the short pulse pauses, the (shunt) diode integrated in the semiconductor switching element T1 accepts the string current. If the solar module 10 is irradiated again and generates power, the control pulses generated by the drive electronics 14 are suppressed again beginning in a pulse pause, so that the solar module 10 can return to its normal function again. If the solar module 10 is defective, the semiconductor switching element T1 is still continuously driven by the drive electronics 14 using the output signal $U_D$ illustrated in FIG. 2.

Figure 4:
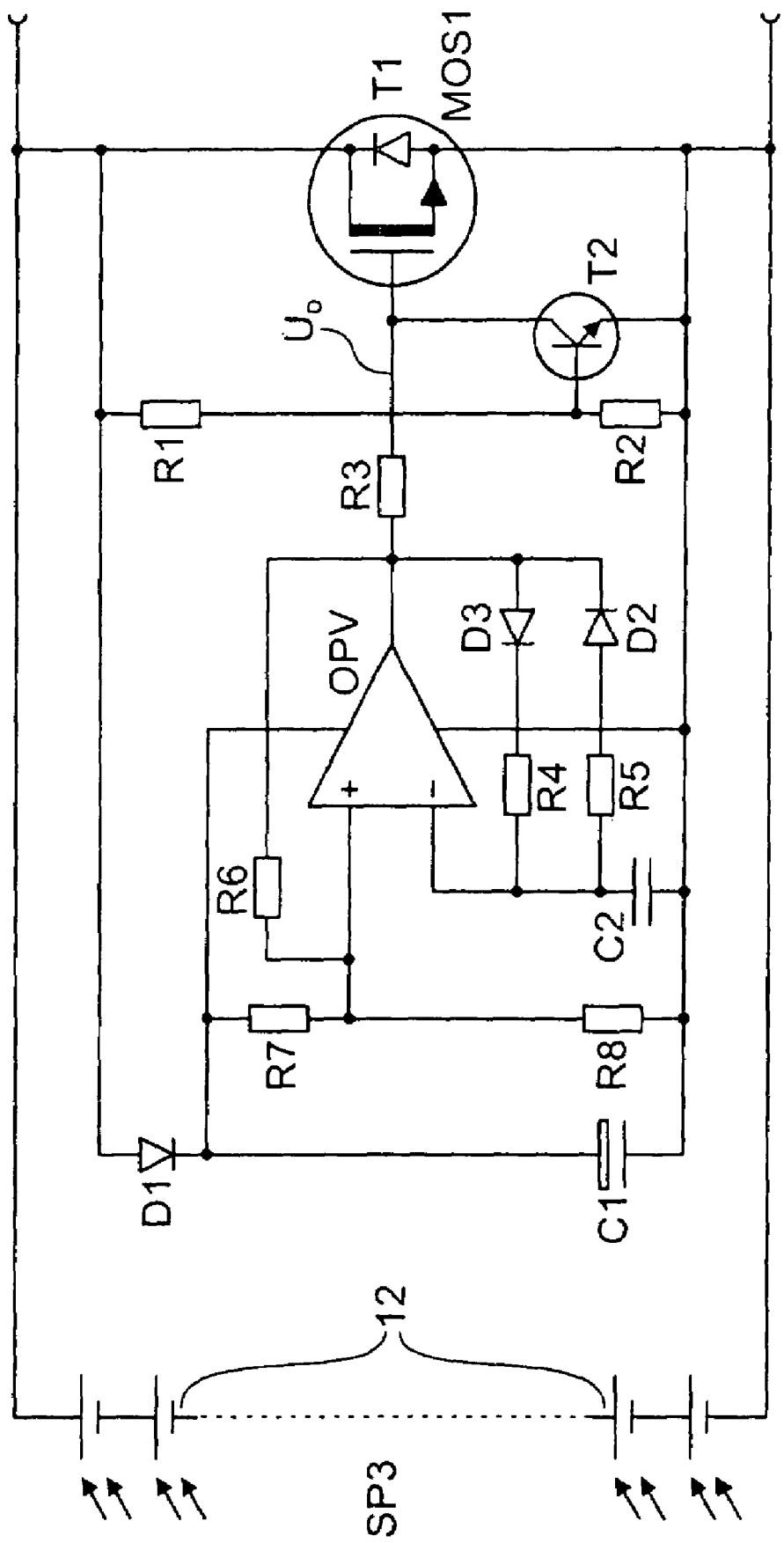
FIG. 4 is a schematic diagram of the solar module of FIG. 2 with a detailed layout of exemplary drive electronics.

The drive electronics 14 may, for example, contain a multivibrator, as is illustrated by way of example in FIG. 4, or may be in the form of an integrated circuit.

Referring to FIG. 4, the drive electronics 14 contain, in particular, an operational amplifier OPV which is connected in the form of an astable multivibrator and has an operating voltage which is provided by the above-mentioned capacitor C1. The output signal $U_D$ from the operational amplifier OPV is supplied through a resistor R3 to a gate connection of the MOSFET transistor T1. A non-inverting input of the operational amplifier OPV is connected to a center tap of a voltage divider, which is formed of two resistors R7 and R8 and is connected in parallel with the capacitor C1. The output of the operational amplifier OPV is fed back through a resistor R6 to its non-inverting input.

The inverting input of the operational amplifier OPV is connected through a capacitor C2 to a base potential of its operating voltage. The output of the operational amplifier OPV is also fed back through a parallel circuit to its inverting input. The parallel circuit includes, on one hand, a first series circuit of a forward-biased diode D2 and a resistor R5 and, on the other hand, a second series circuit of a reverse-biased diode D3 and a resistor R4.

The drive electronics 14, which are constructed as described above, generate, at the output of the operational amplifier OPV, the output signal $U_D$ having the voltage pattern which is illustrated in FIG. 3 and is applied to the semiconductor switching element T1 as explained above. The duration of the control pulses and the duration of the pulse pauses of the voltage pattern of the output signal $U_D$ can be set independently of one another by using the diodes D2 and D3 and the resistors R4 and R5.

If 0.1 Hz, for example, is selected as the oscillation frequency of the multivibrator, the duration of the control pulses could be selected to be 9.9 seconds and the duration of the pulse pauses could be selected to be 0.1 second, for example. After the solar module 10 has been shaded, a time window of 0.1 second would thus result every ten seconds, and the solar module 10 would be able to return to its normal function in the string again in that time window.

While the solar module 10 is generating power, the output signal $U_D$ from the operational amplifier OPV is suppressed so that the MOSFET transistor T1 remains turned off. This is achieved through the use of the circuit described below.

The drive electronics 14 also contain a transistor T2 having a collector which is connected to the output of the operational amplifier OPV and to the gate connection of the MOSFET transistor T1 and having an emitter which is connected to the base potential of the operating voltage of the operational amplifier OPV. A base of the transistor T2 is connected to a center tap of a voltage divider formed of two resistors R1 and R2 which are connected in parallel with the semiconductor switching element T1.

While the solar module 10 is generating power, that is to say is neither in shade nor defective, the transistor T2 is turned on through the voltage divider having the resistors R1 and R2. The gate connection of the MOSFET transistor T1 is thus at its source potential, with the result that the MOSFET transistor T1 turns off. In this operating state, the diode of the MOSFET transistor T1 also turns off and the capacitor C1 is charged through the diode D1.

If the solar module 10 is in shade, for example, and does not generate any power, the transistor T2 turns off, with the result that the output signal $U_D$ from the operational amplifier OPV is applied to the gate connection of the MOSFET transistor T1. As described above, the MOSFET transistor T1 is on with a low impedance during the control pulses and is on through the integrated diode during the pulse pauses in this operating state.

We claim:

1. A photovoltaic system, comprising:
   a string of a plurality of series-connected solar modules each having at least one solar cell;
   a plurality of semiconductor switching elements each connected in parallel with a respective one of said solar modules; and
   a plurality of drive electronics each blocking a respective one of said semiconductor switching elements during power generation by a respective one of said solar modules but otherwise switching said respective one of said semiconductor switching elements to low impedance to bridge said respective one of said solar modules when said respective one of said solar modules is not generating rower due to being in the shade.

2. The photovoltaic system according to claim 1, wherein said semiconductor switching element is a MOSFET transistor.

3. The photovoltaic system according to claim 1, which further comprises a series circuit connected in parallel with said solar module, said series circuit including a diode and a capacitor, said capacitor being charged by said solar module through said diode when said solar module is generating power and otherwise feeding said drive electronics.

4. The photovoltaic system according to claim 1, wherein said drive electronics contain a multivibrator having an output signal being short-circuited when said solar module is generating power.

5. The photovoltaic system according to claim 1, wherein said drive electronics contain an integrated circuit.

6. The photovoltaic system according to claim 1, wherein said drive electronics generate a pulsed control signal having short pulse pauses.

7. The photovoltaic system according to claim 1, wherein said drive electronics also block said respective one of said semiconductor switching elements when said respective one of said solar modules has a defective solar cell.

* * * * *